United States Patent
Dzafic

(10) Patent No.: US 8,274,294 B2
(45) Date of Patent: Sep. 25, 2012

(54) METHOD AND DEVICE FOR CAPTURING A FAULT IN AN ELECTRICAL SUPPLY GRID

(75) Inventor: Izudin Dzafic, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 385 days.

(21) Appl. No.: 12/598,665

(22) PCT Filed: May 3, 2007

(86) PCT No.: PCT/DE2007/000817
§ 371 (c)(1),
(2), (4) Date: Nov. 3, 2009

(87) PCT Pub. No.: WO2008/134995
PCT Pub. Date: Nov. 13, 2008

(65) Prior Publication Data
US 2010/0134117 A1 Jun. 3, 2010

(51) Int. Cl.
*G01R 31/40* (2006.01)
*G01R 15/00* (2006.01)
*H02H 3/00* (2006.01)

(52) U.S. Cl. ............... 324/509; 324/764.01; 702/57; 361/65

(58) Field of Classification Search ............ 324/508, 324/509, 541, 544, 551, 764.01; 702/57, 702/58; 361/65, 79
See application file for complete search history.

(56) References Cited

FOREIGN PATENT DOCUMENTS

| | | |
|---|---|---|
| DE | 10307972 A1 | 9/2004 |
| EP | 0045113 A1 | 2/1982 |
| JP | 3185372 A | 8/1991 |
| JP | 4000214 A | 1/1992 |

*Primary Examiner* — Melissa Koval
*Assistant Examiner* — Farhana Hoque
(74) *Attorney, Agent, or Firm* — Laurence A. Greenberg; Werner H. Stemer; Ralph E. Locher

(57) ABSTRACT

A method for detecting a ground fault in an electrical supply system includes using a combination of components and their connections within the supply system to form virtual components, allowing presetting of fault indicators for incoming and outgoing supply lines to individual components. A fault index can be determined for each virtual component in conjunction with a respective association of a correlation coefficient with fault indicators and a subsequent normalization over all fault indicators using a correlation coefficient. Comparison of the indices of all virtual components of the supply system permits a determination of that virtual component in which the highest fault index occurs, and therefore in which there is the highest probability of a fault. The fault search in a supply system can therefore be determined quickly and easily independently of power supply system geometry and configuration. An apparatus performing the method and computer program product, are also provided.

10 Claims, 4 Drawing Sheets

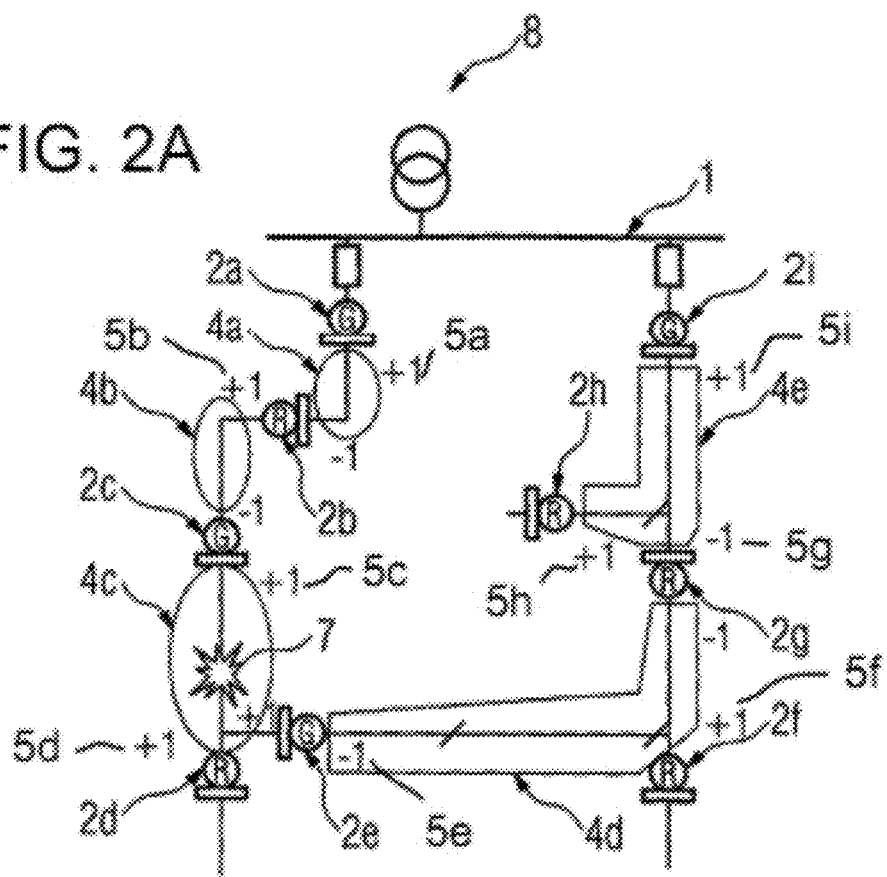

FIG. 3

| | art. Comp. 1 | art. Comp. 2 | art. Comp. 3 | art. Comp. 4 | art. Comp. 5 |
|---|---|---|---|---|---|
| Fl_green_1 | +1*100  3a  5a | | | | |
| Fl_green_2 | | -1*100  3b  5b | | | |
| Fl_green_3 | | | +1*100 or 3c  5c | | +1*100  3k |
| Fl_green_4 | | | +1*100  3d  5d | -1*100  3h | |
| Fl_red_1 | -1*100  3f | | | | |
| Fl_red_2 | | +1*100  3g | | | |
| Fl_red_3 | | | +1*100  3e  5e | +1*100  3i | |
| Fl_red_4 | | | | +1*100  3j | -1*100  3l |
| Fl_red_5 | | | | | +1*100/3m |
| Sum Ind. | 0 | 0 | 300 | 100 | 100 |
| Number Ind. | 2 | 2 | 3 | 3 | 3 |
| FLOC-index | 0  6a | 0  6b | 100  6c | 33.3  6d | 33.3  6f |

METHOD AND DEVICE FOR CAPTURING A FAULT IN AN ELECTRICAL SUPPLY GRID

BACKGROUND OF THE INVENTION

1. Field of the Invention

The invention relates to a method for detection of a fault in particular of a ground short, in an electrical supply system.

Previous methods for detection of a fault within a power supply system distinguish between failure-relevant faults (outage faults) and non-failure-relevant faults (non-outage faults). A different algorithm is required for the two types of fault identifications.

It is also known for the direction of a possible fault, in particular in the form of a ground short, to be determined. By way of example, DE 103 07 972 B4 describes a method for identification and location of low-impedance and high-impedance ground shorts in an electrical supply system.

All of the known methods have the disadvantage that the power supply system configuration and the nature of the possible fault must be available as input variables for simple and rapid location of a fault in an electrical supply system. By way of example, this leads to different location methods being used in parallel and/or successively for fault monitoring of failure-relevant and non-failure-relevant faults, which is time-consuming and costly.

BRIEF SUMMARY OF THE INVENTION

The object of the present invention is therefore to provide a method which does not require any selection process with regard to the fault indicators and which is used in particular in meshed supply systems.

The object is achieved by a method for detection of a fault in an electrical power supply system, in which one component of the electrical supply system is connected to at least one supply line, with the component being combined with some of the input lines and output lines of the supply line to the component to form a virtual component. For the purposes of the method according to the invention, the real components of the electrical supply system are therefore not considered, but artificially formed components of the supply system are formed, and are evaluated for a possible fault. For this purpose, a fault indicator is associated with each supply line that is connected to the component within the virtual component and the direction of a possible fault, in particular of a ground short, is determined.

A correlation coefficient is then assigned to each fault indicator as a function of the direction of the fault. In the situation in which the direction of the fault runs into the virtual component, the number is advantageously +1; in the situation in which the direction of the fault points out of the virtual component, the number –1 is allocated. If the direction of the fault cannot be detected, the number 0.5 is allocated.

The fault indicators associated with the correlation coefficient are then combined to form an index for the virtual components. The highest index and therefore the virtual component with the highest fault probability can thus be determined by comparison of at least two indices of virtual components.

One advantageous embodiment of the method provides that the indices of the virtual components are calculated with respect to in each case one functional group of components. The virtual components for the electrical supply system can be formed on the basis of different considerations. For example, it is not necessary to use all the components of the supply system to form the virtual components. For example, it is possible to define just all of the circuit breakers in the electrical supply system as components and to form corresponding virtual components in this way. Other components are then regarded as part of the supply line and are ignored in the fault calculation.

A distinction between failure-relevant and non-failure-relevant components with correspondingly defined virtual components of the electrical supply system also allows fault location for only those components which have been selected in this way. The components to be considered for fault location in the electrical supply system can then be chosen selectively, in the form of virtual components.

The fault indicators are advantageously weighted with respect to their indication accuracy within the electrical supply system, and correspond to an alphanumeric value.

In one advantageous refinement of the method, the fault indicators of one virtual component are added and normalized with respect to the number of fault indicators, and thus result in a corresponding index for the virtual component. In addition to the arithmetic averaging process mentioned as an example, all mathematical methods for averaging are covered within the meaning of the present invention.

It is considered to be advantageous that the virtual component with the highest index is automatically selected and/or is displayed to an observer. This ensures that the virtual component which has been identified as being faulty is passed onto a viewer or to a system for more accurate checking.

The direction of a possible fault within the section of the electrical supply system under consideration is advantageously determined at periodic intervals.

The object is likewise achieved by an apparatus for carrying out the method according to the invention.

Furthermore, the object is achieved by a computer program product, in which the computer program product is stored in a computer-legible medium and comprises computer-legible means, by means of which a computer is caused to carry out the method according to the invention when the program is run in the computer.

BRIEF DESCRIPTION OF THE SEVERAL VIEWS OF THE DRAWING

Further advantageous refinements can be found in the dependent claims. The subject matter of the invention will be explained with reference to the following drawings, in which:

FIG. 2a shows a schematic illustration of an electrical supply system, with virtual components illustrated;

FIG. 3 shows a tabular illustration of the weighted correlation coefficients of the virtual components with respect to the real components, and the indices which result therefrom.

DESCRIPTION OF THE INVENTION

Figure 1A:
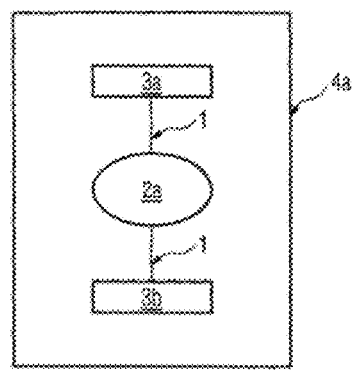
FIG. 1a shows a schematic illustration of a virtual component, with a component corresponding to the method according to the invention.

FIG. 1a shows a virtual component 4a in which a component 2a is connected to a direct input and output within the electrical supply system 1. The line input and output of the component 2a are each associated with a fault indicator 3a, 3b within the virtual component 4a. Furthermore, each fault indicator 3a, 3b is associated with a correlation coefficient 5a, 5b, with the respective correlation coefficient 5a, 5b representing a probability of occurrence for a corresponding fault indicator 5a, 5b within the virtual component 4a. The correlation coefficient 5a, 5b may in this case either be allocated manually by an operator or may be determined automatically by a system, on the basis of the network structure of the electrical supply system 1, with respect to a possible fault 7 (not illustrated) within the electrical supply system.

The further virtual component 4b which is adjacent to a first virtual component 4a likewise once again has a fault indicator 3c on the connecting line 1 of the electrical supply system in the direction of the first virtual component 4a. In the example illustrated in FIG. 1a, a second virtual component 4b, which is arranged underneath the first virtual component 4a, would have a fault indicator 3c directly to the fault indicator 3b.

In comparison to conventional fault searching algorithms, according to the subject matter of the present invention, two independent fault indicators 3b, 3c are allocated on the basis of the concept of a virtual component 4a, 4b to each connecting line between two components 2a, 2b. This has the advantage that it results in a form of normalization of the fault indicators 3a, 3b.

Figure 1B:
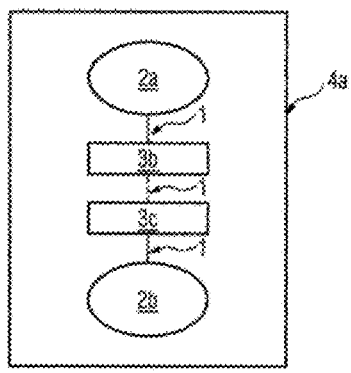
FIG. 1b shows a schematic illustration of a virtual component for the connection of two components corresponding to the method according to the invention.

FIG. 1b shows a differently composed virtual component 4a. The supply line 1 of the electrical supply system is used as a connection between two components 2a, 2b. A possible fault 7 on this section of the supply line 1 is determined by two fault indicators 3b, 3c, which are respectively associated with the components 2a, 2b. Each connecting line is respectively associated with a fault indicator 3b, 3c, as a result of which the corresponding virtual component 4a has three fault indicators 3a to 3c when three components 2a to 2c are connected via a node point within the electrical supply system.

A correlation process can be carried out with respect to the fault 7 on the basis of the determination of the direction of the fault 7 (not illustrated), in particular of a ground short, on the basis of the correlation coefficients 5b, 5c (not illustrated) associated therewith, and the fault indicators 3b, 3c with the corresponding correlation coefficients 5b, 5c therefrom are normalized overall for the virtual component 4a as an index 6a. In the situation in which the direction of the fault 7 points away from the component 2a, a number −1 is allocated, and for the situation in which the direction of the fault 7 points into the component 2a, a number +1 is allocated, as the correlation coefficient 5b. The virtual component 4a in which the fault 7 occurs therefore contains only correlation coefficients 5b, 5c with the number +1, as a result of which the highest fault index 6a occurs here, and therefore the highest probability for the occurrence of a fault 7 in this section of the electrical supply system.

Figure 2B:
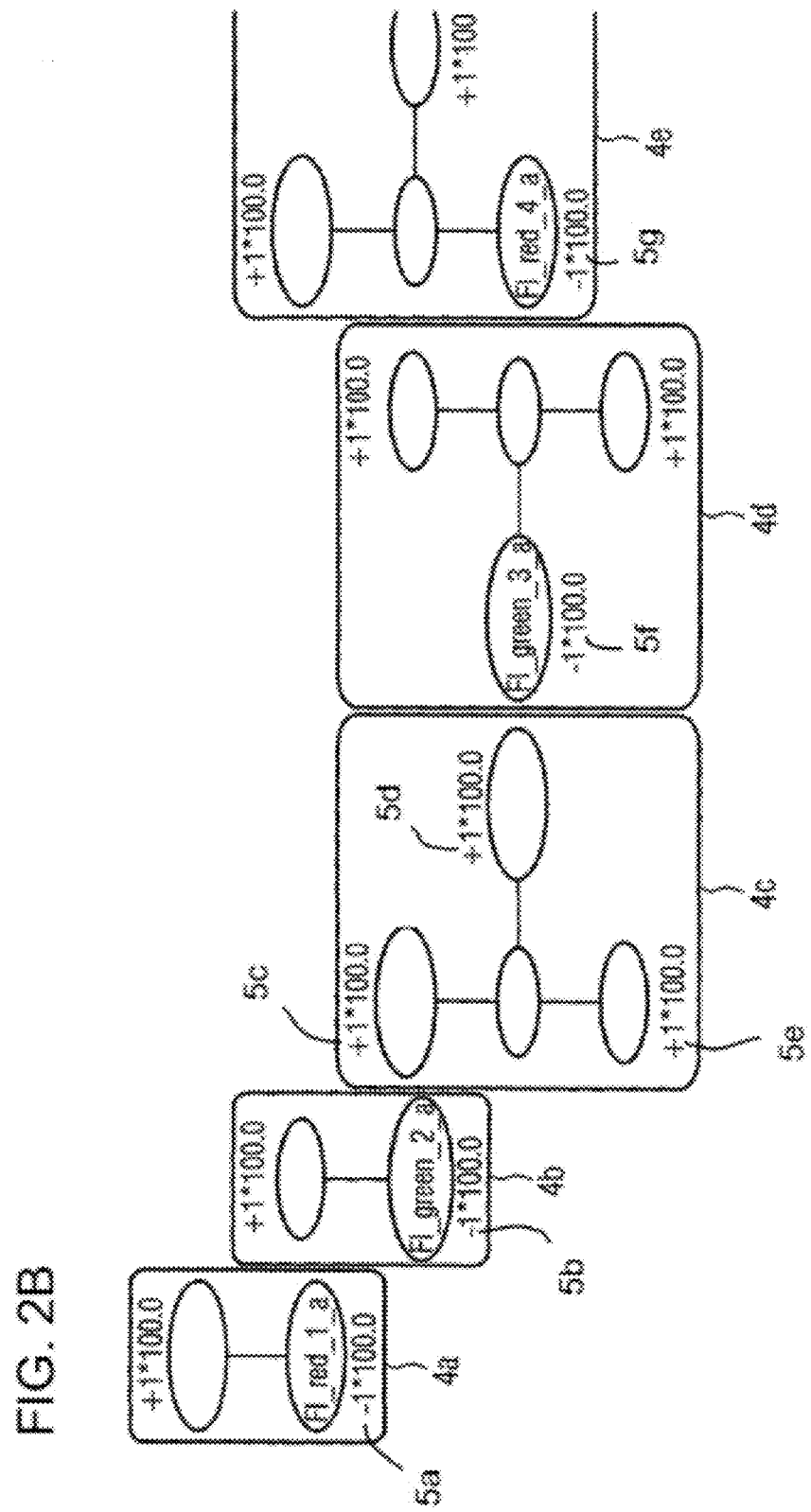
FIG. 2b shows an individual illustration of the virtual components with the associated correlation coefficients.

FIG. 2a shows a detail of an example of a supply system, that is connected via two circuit breakers 2a, 2i via a transformer 8 to a main voltage line which does not need to be monitored. The present situation is based on the assumption that the circuit breakers 2a, 2i and the transformer 8 do not need to be monitored for possible faults 6.

In the present example, the electrical supply system to be monitored is subdivided into five virtual components 4a to 4e which contain at least one component 2a to 2i, and in which a fault indicator 3a to 31 (not illustrated) is associated with each input line or output line of the supply line 1. In this context, this is illustrated in FIG. 2a as +1 or −1, depending on the direction of the fault in the correlation coefficients 5a to 5i.

The virtual component 4c has a node point of the supply line 1 and therefore three components 2c, 2d, 2e. This virtual component 4c is therefore associated with three fault indicators 3c, 3d, 3e with corresponding correlation coefficients 5c, 5d, 5e. Since, in the present example, the fault 7 occurs in this virtual component 4c, the corresponding correlation coefficients 5c, 5d, 5e are all +1, on the basis of the direction of the fault 7. In all of the other virtual components 4a, 4b, 4d, 4e, the correlation coefficients 5a, 5b, 5f to 5i are not all +1. This is also evident from the illustration of the individual virtual components 4a to 4e shown in FIG. 2b.

FIG. 3 shows a tabular illustration of the relevant fault indicators 5a to 5i of the virtual components 4a to 4e (as art. Comp. 1 to art. Comp 5 in the table). The individual components 2a to 2i are shown as F1-green_1 to F1_red_5. In the virtual component 4c, because of the fault 7 that has occurred there (not illustrated), the fault indicators 3c, 3d, 3e multiplied by the value 100 are added to the correlation coefficients 5c, 5d, 5e in the form of +1 to form a sum which has the highest fault index 6c, normalized by the number of fault indicators 5a to 5i under consideration in the present example.

The invention claimed is:

1. A method for detection of a fault in an electrical power supply system, the method comprising the following steps:
   connecting a component of the electrical supply system to at least one supply line and combining the component with some input lines and output lines of the supply line to the component to form a virtual component;
   in a computer, associating a fault indicator with each supply line connected to the component within the virtual component;
   in the computer, determining a direction of a possible fault;
   in the computer, assigning a correlation coefficient to each fault indicator as a function of the direction of the fault;
   in the computer, combining at least two fault indicators of a virtual component to form an index; and
   in the computer, comparing at least two indices of virtual components with one another.

2. The method according to claim 1, wherein the possible fault is a ground short.

3. The method according to claim 1, which further comprises, in the computer, calculating each of the indices of the virtual components with respect to one respective functional group of components.

4. The method according to claim 1, which further comprises, in the computer, weighting the fault indicators with respect to their indication accuracy within the electrical supply system.

5. The method according to claim 1, wherein the fault indicator corresponds to an alpha numeric value.

6. The method according to claim 1, which further comprises, in the computer, adding and normalizing the fault indicators of one virtual component with respect to a number of fault indicators, resulting in a corresponding index.

7. The method according to claim 1, which further comprises, in the computer, automatically selecting and/or displaying the virtual component with the highest index to an observer.

8. The method according to claim 1, which further comprises, in the computer, carrying out the step of determining the direction of a possible fault at periodic intervals.

9. An apparatus for detection of a fault in an electrical power supply system, the apparatus comprising a computer with a non-transient computer readable medium having stored thereon a set of computer readable instructions causing the computer to perform the following steps when the set of computer readable instructions is executed on the computer:
   obtaining a virtual component formed by connecting a component of the electrical supply system to at least one supply line and combining the component of the electrical supply system with some input lines and output lines of the supply line to the component of the electrical supply system;

associating a fault indicator with each supply line connected to a component within a virtual component;

determining a direction of a possible fault;

assigning a correlation coefficient to each fault indicator as a function of the direction of the fault;

combining at least two fault indicators of a virtual component to form an index; and comparing at least two indices of virtual components with one another.

10. A non-transient computer readable medium having stored thereon a set of computer readable instructions causing a computer to perform the following steps when the set of computer readable instructions is executed on the computer:

obtaining a virtual component formed by connecting a component of an electrical power supply system to at least one supply line and combining the component of the electrical supply system with some input lines and output lines of the supply line to the component of the electrical supply system;

associating a fault indicator with each supply line connected to a component within a virtual component;

determining a direction of a possible fault;

assigning a correlation coefficient to each fault indicator as a function of the direction of the fault;

combining at least two fault indicators of a virtual component to form an index; and comparing at least two indices of virtual components with one another.

* * * * *